United States Patent
Baecker et al.

(10) Patent No.: US 8,394,741 B2
(45) Date of Patent: Mar. 12, 2013

(54) HIGH-TEMPERATURE SUPERCONDUCTIVE LAYER ARRANGEMENT

(75) Inventors: Michael Baecker, Cologne (DE); Oliver Brunkahl, Remagen (DE); Martina Falter, Swisstal-Buschhoven (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 12/935,021

(22) PCT Filed: Mar. 14, 2009

(86) PCT No.: PCT/DE2009/000357
§ 371 (c)(1),
(2), (4) Date: Jan. 10, 2011

(87) PCT Pub. No.: WO2009/121321
PCT Pub. Date: Oct. 8, 2009

(65) Prior Publication Data
US 2011/0263433 A1    Oct. 27, 2011

(30) Foreign Application Priority Data
Mar. 29, 2008 (DE) .......................... 10 2008 016 258

(51) Int. Cl.
*H01L 39/24* (2006.01)
(52) U.S. Cl. ........................ 505/237; 505/238
(58) Field of Classification Search .................. 505/237, 505/238
See application file for complete search history.

(56) References Cited

U.S. PATENT DOCUMENTS
2007/0197045 A1    8/2007  Baecker et al.

FOREIGN PATENT DOCUMENTS

| | | |
|---|---|---|
| DE | 10 2004 038 030 A1 | 3/2006 |
| EP | 1 195 819 A1 | 4/2002 |
| WO | 00/16412 A1 | 3/2000 |
| WO | 03/044836 A2 | 5/2003 |
| WO | 2006/082164 A1 | 8/2006 |

OTHER PUBLICATIONS

A. Ayala et al., "Synthesis and Characterization of Cu-Doped SrTiO3 Powders and Sol-Gel Processed Buffer Layers on IBAD MgO Templates", IEEE Transactions on Applied Superconductivity, vol. 15, No. 2, pp. 2703-2706, Jun. 2005.
D. Chambonnet et al, "Control of the 2D/3D transition of the growth mechanism in the YBCO/Ce1-xLaxO2-x/2/SrTiO3 system", Physica C, vol. 302, pp. 198-206, (1998).
I. E. Mukovozov et al., "Structural effects of interaction between lanthanum cuprate and cerium dioxide", Journal of Materials Science, vol. 32, pp. 4991-4997, (1997).
H. Lv et al., "Synthesis and electrochemical behavior of Ce1-xFexO2-s as a possible SOFC anode materials", Solid State Ionics, vol. 177, pp. 3467-3472, (2007).
J. Liang et al., "Phase Diagram of SrO-CaO-CuO Ternary System", Solid State Communications, vol. 75, No. 3, pp. 247-252, (1990).
Int'l Search Report issued on Jul. 23, 2009 in Int'l Application No. PCT/DE2009/000357.
Written Opinion issued on Jul. 23, 2009 in Int'l Application No. PCT/DE2009/000357.
Office Action Issued Sep. 30, 2008 in German Appln. Ser. No. 10 2008 016 258.2.

*Primary Examiner* — Colleen Dunn
(74) *Attorney, Agent, or Firm* — Panitch Schwarze Belisario & Nadel LLP

(57) ABSTRACT

A high-temperature superconductor layer arrangement includes at least one substrate and one textured buffer layer made of oxidic material. The buffer layer displays at least one further constituent forming a homogeneous mixed-crystal layer. The further constituent is a transition metal from the first subgroup and/or forming at least a partial melt with the oxidic buffer material at an annealing temperature of $\leq 1{,}600$ degrees Celsius. The further constituent can particularly be copper and/or silver.

33 Claims, No Drawings

HIGH-TEMPERATURE SUPERCONDUCTIVE LAYER ARRANGEMENT

CROSS-REFERENCE TO RELATED APPLICATIONS

This application is a Section 371 of International Application No. PCTDE2009/000357, filed Mar. 14, 2009, which was published in the German language on Oct. 8, 2009, under International Publication No. WO 2009/121321 A1 and the disclosure of which is incorporated herein by reference.

BACKGROUND OF THE INVENTION

The invention relates to a high-temperature superconductor layer arrangement, comprising at least one substrate and one textured buffer layer, that permits textured growing of a high-temperature superconductor (HTSC) layer.

The buffer layer has a host of different functions. First, it is intended to transfer the texture from the textured substrate, which displays the highest possible degree of texturing, as completely and perfectly as possible to the HTSC layer to be grown. It must be taken into consideration in this context that the substrate is biaxially textured to the greatest possible extent, i.e. both perpendicularly to the layer and in an axial direction within the layer. Corresponding biaxial texturing of the high-temperature superconductor is necessary to achieve high critical currents and high current densities. Furthermore, the buffer layer is intended to prevent any diffusion of constituents or contaminants of the substrate into the HTSC layer, since this can reduce the critical current density and/or the absolute critical current of the high-temperature superconductor, or the superconductive state can be disrupted. Moreover, the buffer layer is intended to display the greatest possible adhesive strength in relation to both the substrate and the high-temperature superconductor to be grown. The buffer layer must additionally display sufficient mechanical and temperature cycling properties, taking both the manufacturing conditions and the operating conditions into account. Furthermore, the buffer layer should permit the simplest possible, reproducible manufacture at a high process speed.

Up to now, a number of different materials have been used as the buffer layer material, such as yttrium-stabilized zirconium oxide (YSZ); various zirconates, such as gadolinium zirconate, lanthanum zirconate and the like; titanates, such as strontium titanate; and simple oxides, such as cerium oxide, magnesium oxide and the like. To fulfill the complex and demanding requirements profile existing today, and particularly to guarantee a high degree of texture transfer and an efficient diffusion barrier, the buffer layer consists of layer combinations comprising multiple, different buffer materials, sometimes five or more layers. The application of multiple layers of buffer material is, however, extremely complex in terms of process engineering, and significantly reduces the production speed of the overall process for manufacturing a functional HTSC layer arrangement, even if continuous processes are used for the manufacture of strips, for example. Use of a single-layer buffer layer made of conventional materials is, however, only inadequately capable of meeting the complex requirements profile.

There is moreover a need to further enhance the quality of the high-temperature superconductor layers in terms of their homogeneity and texture. For example, the proportion of areas of the HTSC layer that do not display HTSC material, e.g. owing to porosity of the HTSC layer or as a result of foreign phases, needs to be minimized as far as possible. Further to be avoided are areas that have incorrect texturing, which can display not only skewing relative to the preferred orientation, but also areas with a completely different crystal orientation. These properties of the HTSC layer can partly be influenced by the choice of the precursors of the HTSC materials in chemical deposition processes, and by the parameters of the deposition and annealing processes, although the effects are difficult to predict and occasionally opposite. Also, because of the multi-component systems of the HTSC materials, the kinetics of the decomposition of the precursors and of the crystallization of the HTSC material are often difficult to control, meaning that changing the process parameters is often undesirable.

As far as possible, these requirements are, in particular, to be met by an HTSC layer arrangement in which the buffer layer and/or the HTSC layer can be manufactured by chemical solution deposition. Owing to the associated processes during thermal formation of the buffer and HTSC layers, special requirements must also be imposed on the production of these layers. In particular, the kinetics of layer formation and crystallization differ fundamentally from the requirements when producing these layers by physical methods, such as pulsed laser deposition (PLD), thermal co-evaporation (TCE), metal-organic chemical vapor deposition (MOCVD), and the like.

BRIEF SUMMARY OF THE INVENTION

An object of the invention is thus to provide a high-temperature superconductor layer arrangement that displays an HTSC layer that is dense, homogeneous, crack-free and as smooth as possible, or on which an HTSC layer of this kind can be produced by growing on the buffer layer, where the layers can preferably be manufactured by chemical solution deposition. The object furthermore consists in providing a method for manufacturing layer arrangements of this kind.

This object is solved by an HTSC layer arrangement of the type described at the outset, in which the textured buffer layer contains at least one further constituent forming a homogeneous mixed-crystal phase, the further constituent being a transition metal from the first subgroup and/or forming at least a partial melt with the preferably oxidic buffer material at an annealing temperature of $\leq 1{,}600$ degrees Celsius, where the further constituent is preferably a metal or a metal oxide. The further constituent, which forms a homogeneous mixed-crystal phase with the buffer layer material, surprisingly makes it possible to produce a buffer layer that displays very little or virtually no porosity, and moreover very little roughness, and that can be manufactured with a high density and virtually no cracks. Moreover, a buffer layer of this kind can be produced by chemical solution deposition (CSD).

As a result of the further constituent, which forms a homogeneous, solid mixed-crystal phase with the buffer layer material, at least a partial melt can be formed when producing the buffer layer, meaning that at least partial recrystallization of the buffer layer material can take place during the subsequent annealing treatment, in which context a liquid phase is formed intermediately, at least in some areas. This makes it possible for the texture of the substrate to be transferred to the buffer layer, and thus ultimately to the HTSC layer, far better than when using the buffer layer material without the further constituent, and additionally to produce a buffer layer that has substantially reduced porosity and microcracks, or virtually none at all, and is additionally much smoother than conventional layers. In this context, the further constituent can be a metal and/or a metal oxide, and/or a precursor thereof that, at the annealing temperature forming at least a partial melt, releases a metal or oxide of this kind, such as a hydroxide, carbonate, nitrate, citrate, alkyl carboxylate, acetylacetonate or another suitable metal chelate or the like, including mixtures thereof.

As a result of the buffer layer according to the invention, the HTSC layer growing on it can likewise be produced very homogeneously, i.e. virtually without pores or other areas that, like microcracks for instance, impede superconductive continuity, where the HTSC layer can additionally be produced very smoothly. Texture transfer may also be improved. In particular, there is also a dramatic reduction in growing defects on the buffer layer, such as can occur in the area of pores of conventional buffer layers and can lead to areas with a different crystal orientation. An HTSC layer of this kind displays enhanced physical and mechanical properties, particularly also as regards the superconductive properties, such as the critical current density and the absolute critical current $I_C$, as a result of which it is also possible to manufacture electronic HTSC components with improved properties.

The result is surprising insofar as formation of the buffer layer during application of the buffer layer material by chemical solution deposition encompasses a host of complicated physico-chemical processes, such as evaporation of the solvent, decomposition of buffer layer material, formation of amorphous solid phases of buffer layer material, and recrystallization thereof, in which context the changed thermal properties of the buffer layer material also have to be taken into consideration in view of the complex temperature control of the process for producing the buffer layer.

DETAILED DESCRIPTION OF THE INVENTION

The substrate is preferably textured, particularly biaxially textured, i.e. perpendicularly to the layer plane on which the HTSC material is grown, and in a direction within the layer plane, e.g. in the longitudinal direction of the strip in the case of a strip-shaped substrate. The substrate can be strip-shaped, but also have different dimensions, e.g. in the form of more isometric layers. The buffer layer usually comprises an oxide-ceramic material or a metal oxide.

Preferably, the further constituent forms an only partial melt with the buffer layer material at temperatures in the range from 1,600 to 500° C., 1,400 to 600° C., 1,250 to 700° C., or 1,100 to 800° C., such that the solid and liquid phases of the buffer layer material coexist with each other, or a virtually homogeneous or complete melt. This also applies in the event that the further constituent is a transition metal and/or a transition metal oxide.

In general, the further constituent, and its concentration in the buffer layer material, can be selected in such a way that it forms at least a partial melt, or a complete melt, when subjected to annealing treatment at $\leq 1,600°$ C., preferably at $\geq 500°$ C. In particular, the further constituent, and its concentration in the buffer layer material, can be selected in such a way that it forms at least a partial melt, or a complete melt, when subjected to annealing treatment at $\leq 1,500°$ C. or $\leq 1,300$ to $1,400°$ C., preferably $\leq 1,100$ to $1,200°$ C. or $\leq 900$ to $1,000°$ C. It goes without saying that the annealing temperature must be selected in such a way that the buffer layer material does not suffer any unwanted decomposition or volatilization of constituents and the substrate is not impaired, e.g. by formation of undesirable phases or detrimental alteration of its texture.

The further constituent can be used in the buffer layer material at such a concentration that, preferably during annealing treatment at $\leq 1,500$ to $1,600°$ C., but also during further cooling to, for example, $\leq 800$ to $900°$ C., $\leq 600$ to $700°$ C., $\leq 400$ to $500°$ C., 200 to $300°$ C., or to room temperature, or lower temperatures down to approx. 70 to 80 Kelvin or lower, no amorphous phases or no mixed phases are formed, e.g. due to phase transitions, and the homogeneous mixed-crystal phase also displays long-term stability below the annealing temperature. The homogeneous solid mixed-crystal phase containing the further constituent can display long-term kinetic stability at room temperature and/or at the operating temperature of the HTSC material, and it is preferably also thermodynamically stable in the temperature range from the annealing treatment (see above) to the operating temperature of the HTSC material, such that separation processes or phase segregation, precipitation of amorphous phases, or other phase changes do not occur.

Moreover, the further constituents should generally not have a significant tendency, or any tendency, to diffuse into the HTSC layer and cause (detrimental) changes in the mechanical and/or physical properties thereof, particularly reduction of the critical current density and/or the absolute critical current.

Preferably, the further constituent forming the homogeneous mixed-crystal phase is one or more of the metals of the first subgroup, e.g. Cu, Ag, Ti, V, Cr, Mn or Zn, particularly preferably Cu and/or Ag, or also Ti, Cr or Zn, where appropriate, or at least contains such a metal. Where appropriate, Fe, Ni and/or Co can also be used, although they are not preferred owing to the magnetic properties of their compounds. The above-mentioned transition metals can in each case be used singly or in combination, e.g. copper and/or silver in combination with another one or more of the metals mentioned above. Where appropriate, the further constituent can alternatively or additionally also contain other metals, e.g. one or more metals from the group of main-group metals, such as alkali and/or alkaline-earth metals, metals and semimetals of the third, fourth, fifth or sixth main group (such as B, Si, Ge, As, Se, Sb, Te), insofar as they form a homogeneous mixed-crystal phase with the buffer layer material, that form at least a partial melt during annealing treatment at $\leq 1,600°$ C. or the above-mentioned temperatures, and are not subject to any phase transitions or precipitation of other phases, including the formation of amorphous phases, at lower temperatures, particularly at the temperatures mentioned above. The further constituent is preferably present in the form of an oxide, forming a mixed oxide with the buffer layer material, where the further constituent can be introduced by a precursor. The further constituent is preferably predominantly or entirely present in a medium or low oxidation state >0, e.g. in an oxidation state of 1, 2, 3 or 4, preferably 1 to 3, or an oxidation state of 1 or 2, insofar as this oxidation state is sufficiently stable. In particular, copper can be present in the form of Cu(I).

The at least one further constituent, or the combination of further constituents, can be present at a concentration of up to 40 atom %, relative to the total metal content of the buffer layer, or also at a higher concentration, where appropriate, provided that a homogeneous mixed-crystal phase is formed with the buffer layer material that is preferably also stable below the annealing temperature, as indicated above. The further constituent can be present at a concentration of $\geq 1$ to 2 atom % or $\geq 3$ to 5 atom %, preferably at a concentration of $\geq 7$ to 10 atom %, relative in each case to the total metal content of the buffer layer material. The concentration of the at least one further constituent, or of the combination of further constituents, can be $\leq 30$ to 35 atom % or, where appropriate, $\leq 20$ to 25 atom %, relative to the total metal content of the buffer layer.

The buffer layer material, which, according to the invention, is doped with the at least one further constituent, forming a homogeneous mixed-crystal phase, can be a rare-earth element oxide, particularly a binary, ternary or multinary rare-earth element oxide, an oxide of a transition metal, particularly from the second or third subgroup, or also from the first subgroup, where appropriate, or a main-group metal oxide, including in each case a binary, ternary or multinary oxide of the same. The buffer layer material can also be a rare-earth element/transition-metal oxide, where the transition metal can be one from the first, second and/or third subgroup, preferably the second and/or third subgroup. Rare-earth elements within the meaning of the invention are Sc, Y, La, and the lanthanides (Ln). Where appropriate, the buffer layer material can also be a simple oxide of a rare-earth element, main-group metal or transition metal. For example, the buffer layer material can be a zirconate, aluminate, titanate, manganate or ruthenate. The buffer layer material can, for example, also be zirconium oxide, particularly yttrium-stabilized zirconium oxide (YSZ), nickel oxide, cerium oxide, magnesium oxide or, where appropriate, also another alkaline-earth metal oxide.

The buffer layer material taking up the further constituent is particularly preferably a rare-earth element oxide, preferably a binary or multinary rare-earth element oxide, which can display the general formula $RE_{2+x}M_{2+y}O_z$, where $-2 \leq x, y \leq 2$, preferably $-1 \leq x, y \leq 1$, where it preferably applies that if $x \leq 0$, then $y \geq 0$, and if $y \leq 0$, then $x \geq 0$. Preferably, $x = -y$ in each case. x, y can each be 0, independently of each other. It can be that $x+y=\pm\partial$, where $\partial$ can be $\leq 0.5$ to 1, preferably $\leq 0.2$ to 0.3 or $\leq 0.15$ to 0.1. If $\partial$ is less than 0, the cation lattice can display lattice vacancies; if $\partial$ is greater than 0, interstitial positions, such as octahedron gaps, may additionally be occupied. In particular, $\partial$ can be equal to 0. RE is one or more rare-earth elements, and M is one or more divalent, trivalent, tetravalent or pentavalent metals, including rare-earth elements. z can vary, particularly in the range from 5 to 8, e.g. in the range from 6 to 8. In particular, the formula $RE_{2+x}M_{2+y}O_{5-8}$, where $-1 \leq x, y \leq 1$, or $RE_{2+x}M_{2+y}O_{7\pm 2z}$, where $-1 \leq x, y \leq 1$ and $0 \leq z \leq 0.5$, can apply; particularly preferably, the formula $RE_{2+x}M_{2+y}O_{5-8}$, where $-0.5 \leq x, y \leq 0.5$, or $RE_{2+x}M_{2+y}O_{7\pm 2z}$, where $-0.5 \leq x, y \leq 0.5$ and $0 \leq z \leq 0.5$, can apply, where the statements made above can apply in all other respects. Generally, the value of z is such that a neutral charge balance is established as a result. It can be that $5 \leq z \leq 8$ or $z=7$.

RE can in each case be one or more metals, selected from the group comprising La, Y, and Ln (Ce, Pr, Nd, Pm, Sm, Eu, Gd, Tb, Dy, Ho, Er, Tm, Yb, Lu), particularly only from the group comprising La and Ln or only from the group comprising Ln. In particular, Ln can in each case be one or more metals from the group comprising Ce, Nd, Sm, Eu, Gd, Yb. Independently hereof, or in combination herewith, M can be one or more metals, selected from the group comprising the transition metals, including the lanthanides (Ln), and main-group metals, including Zn. M can be one or more metals from the group comprising the transition metals, including the lanthanides, or one or more metals from the group comprising the rare-earth elements, or from the group comprising lanthanum and the lanthanides. M can in each case also be one or more metals from the transition metals of the first, second and/or third subgroup, preferably of the second and/or third subgroup, in each case excluding the lanthanides and actinides. Where appropriate, M can also be in the form of one or more lanthanides in combination with one or more transition metals other than the lanthanides and actinides. Where appropriate, M can in each case also include Sc, La, and Y. Preferably, M is one or more metals with a valence of three to five, particularly of three to four or of four to five. If M is several metals, they preferably have the same valence, preferably 3, 4 or 5. Thus, M can in each case be one or more metals from the group comprising Sr, Ba, Ga, In, Tl, Sn, Pb, and Bi, or also As, Sb, Se or Te, or tantalum, niobium. Alternatively or additionally, M can be one or more metals from the group comprising rare-earth element, hafnium, zirconium, tantalum, niobium. Particularly preferably, M is one or more of the metals cerium, hafnium or zirconium, particularly cerium. The rare-earth element (particularly also cerium), hafnium or zirconium can be partially substituted, as described below, in each case particularly by another metal from the group comprising rare-earth element, particularly cerium, hafnium and zirconium. Where appropriate, the same metal atom, such as a rare-earth element, including Ln, Hf or Zr, can also be present at various positions.

In particular, the buffer material taking up the further constituent can display two or more different rare-earth elements RE and RE', which can in each case and independently of each other particularly be La, Y or a lanthanide (Ln), such as Ce, Pr, Nd, Sm, Eu, Gd, Tb, Dy, Ho, Er, Tm, Yb, Lu, particularly Ce, Nd, Sm, Eu, Gd, Yb, specifically Ce. In particular, RE can be equal to La and/or Y in each case. Independently of each case, RE and RE' can also be selected from the group comprising Ce, Nd, Sm, Eu, Gd, Yb, specifically Ce, particularly if RE is equal to La or Y. In this context, the buffer layer material taking up the further constituent can have the formula $RE_{2+x}RE'_{2+y}O_{7\pm z}$, $RE_2RE'_2O_{7\pm z}$, $La_{2+x}RE_{2+y}O_{7\pm z}$ (where RE is not equal to La), $La_2RE_2O_{7\pm z}$ (where RE is not equal to La), $La_{2+x}Ln_{2+y}O_{7\pm z}$, $La_2Ln_2O_{7\pm z}$, or $Ln_{2+x}Ln'_{2+y}O_{7\pm z}$, $Ln_2Ln'_2O_{7\pm z}$, in each case with $-2 \leq x, y \leq 2$, or preferably $-1 \leq x, y, z \leq 1$, where La can in each case be partially or completely substituted by Y. Particularly preferred in each case is $-0.5 \leq x, y \leq 0.5$, where the above statements can apply in all other respects. It is preferable in each case that if $x \leq 0$, then $y \geq 0$, and if $y \leq 0$, then $x \geq 0$. Preferably, $x = -y$ in each case. Generally, the value of z is such that a neutral charge balance is established as a result, particularly a value where it applies that $5 \leq 7 \pm z \leq 8$, where z can also be 0.

In particular, the buffer material taking up the further constituent can be a rare-earth (RE)/transition metal (TM) oxide, where TM is a transition metal with the exception of the lanthanides and actinides, e.g. according to the general formula $(La,Ln)_{2+x}TM_{2+y}O_{7\pm 2z}$, $(La,Ln)_2TM_2O_{7\pm 2z}$, $RE_{2+x}TM_{2+y}O_{7\pm 2z}$, $RE_2TM_2O_{7\pm 2z}$, $Ln_{2+x}TM_{2+y}O_{7\pm 2z}$, $Ln_2TM_2O_{7\pm 2z}$, $La_{2+x}TM_{2+y}O_{7\pm 2z}$ or $La_2TM_2O_{7\pm 2z}$, where RE, Ln and/or TM can, where appropriate, in each case be just one metal selected from the respective group, and where in each case $-2 \leq x, y \leq 2$, or preferably $-1 \leq x, y, z \leq 1$, particularly preferably $-0.5 \leq x, y \leq 0.5$ in each case. (La,Ln) indicates that La and/or Ln can be present. In each case, it can be that x and/or y=0, also independently of each other. It is preferable in each case that if $x \leq 0$, then $y \geq 0$, and if $y \leq 0$, then $x \geq 0$. Preferably, $x = -y$ in each case. Generally, the value of z is such that a neutral charge balance is established as a result. It can apply to z in each case that $0 \leq z \leq 1$ or $0 \leq z \leq 0.5$, or $5 \leq 7 \pm 2z \leq 8$ is obtained in each case.

The buffer layer material (without the further constituent) can particularly be selected from $RE_{2+x}Ce_{2+y}O_{7+z}$, $RE_2Ce_2O_{7+z}$ (preferably RE=La, Nd, Sm, Eu, Gd, Y, and Yb) or $(La,Ln)_{2+x}Ce_{2+y}O_{7+z}$, $(La,Ln)_2Ce_2O_{7+z}$ (preferably Ln=Nd, Sm, Eu, Gd, and Yb, particularly Sm, Eu, Gd, Yb), $RE_{2+x}Zr_{2+y}O_{7+z}$, $RE_2Zr_2O_{7+z}$ (preferably RE=La, Nd, Sm, Eu, Gd, Y, and Yb) or $(La,Ln)_{2+x}Zr_{2+y}O_{7+z}$, $(La,Ln)_2Zr_2O_{7+z}$ (preferably Ln=Nd, Sm, Eu, Gd, and Yb, particularly Gd, Sm and/or Nd). In this context, Ce can be partially or completely substituted, e.g. by Hf, Ti, Zr, Ta, Nb and/or Sn. The buffer layer material can also be a phase with the composition $(Ln'_{2-x}Ln''_x)M_2O_{7+z}$, where M can, for example, be Zr, Hf, Ti or Sn, particularly Zr. This material can likewise be doped with a transition metal in each case. Generally, the value of z is such that a neutral charge balance is established as a result, particularly a value where it applies that $5 \leq 7 \pm z \leq 8$, where z can also be 0.

It can in each case be that x and/or y=0, independently of each other. It can in each case be that $-2 \leq x$, $y \leq 2$, preferably $-1 \leq x, y, z \leq 1$, particularly preferably $-0.5 \leq x, y \leq 0.5$ in each case. It is preferable in each case that if $x \leq 0$, then $y \geq 0$, and if $y \leq 0$, then $x \geq 0$. Preferably, $x=-y$ in each case. Generally, the value of z is such that a neutral charge balance is established as a result, particularly a value where it applies that $5 \leq 7 \pm z \leq 8$, where z can also be 0. It can apply to z in each case that $0 \leq z \leq 1$ or $0 \leq z \leq 0.5$.

The buffer material can also be a binary or multinary rare-earth element cerium oxide that can also display further components and can, for example, be a main-group metal/rare-earth element cerium oxide, a transition metal/rare-earth element cerium oxide or a mixed form between these, such as a main-group metal/transition metal/rare-earth element cerium oxide.

TM can generally also be present in different oxidation states, particularly if two or more different transition metals are present. Preferably, TM is in each case just one metal of the transition metals.

In particular, the buffer layer material (without the further constituent) can be a rare-earth oxide having the general formula $RE_{2-x}RE'_xM_{2-y}M'_yO_{7 \pm 2z}$ or $Ln_2Ln'_xM_{2-y}M'_yO_{7 \pm 2z}$, where $0 \leq x, y, z \leq 1$, particularly $0 \leq z \leq 0.5$, where RE and RE', Ln and Ln', and M and M' are in each case different metals from the aforementioned groups, preferably trivalent or tetravalent or pentavalent metals in each case. Particularly preferably, $-0.5 \leq x, y \leq 0.5$ in each case. Generally, the value of z is such that a neutral charge balance is established as a result, particularly a value where it applies that $5 \leq 7 \pm 2z \leq 8$, where z can also be 0.

The buffer material can also be a binary or multinary rare-earth element cerium oxide that can also display further components and can, for example, be a main-group metal/rare-earth element cerium oxide, a transition metal/rare-earth element cerium oxide or a mixed form between these, such as a main-group metal/transition metal/rare-earth element cerium oxide.

The oxides can generally in each case be stoichiometric or non-stoichiometric in relation to the metal components and/or the oxygen content, e.g. in the sense of mixed compounds or in the form of defect compounds. The rare-earth element oxides can contain two, three or more different rare-earth elements. If transition metals are contained, one, two, three or more different transition metals can be present. The transition metals can display the same or different oxidation states in each case. In the formulas indicated above, it can also be in each case that x=0 and/or y=0, independently of each other. It can generally also be in the above formulas that $0 \leq x, y \leq 0.5$ or $0 \leq x, y \leq 0.25$, $0 \leq x, y \leq 1$ or $0 \leq x, y \leq 0.05$. Generally, the value of z is such that a neutral charge balance is established as a result.

Where appropriate, the buffer layer material can also be cerium oxide ($CeO_2$ or $CeO_{2-z}$). In this context, cerium can be partially substituted, forming binary oxides, by Al, Hf, Ti, Zr, Sn, Ta, Nb or another rare-earth element, particularly La, Nd, Sm, Eu, Gd, Y and Yb.

The rare-earth elements of the above-mentioned oxides can be partially substituted by other transition metals, e.g. transition metals from the first, second and/or third subgroup, particularly by metals from the second and/or third subgroup (excluding the lanthanides and actinides in each case). In this context, individual positions in the crystal structures of the rare-earth element oxides can be partially or completely substituted, e.g. forming homogeneous mixed-crystal phases. Where appropriate, the rare-earth elements and/or transition metals of the above-mentioned oxides can, independently of each other, also be partially substituted by main-group metals, e.g. by one or more metals from the group of alkaline metals, such as Cs, Rb, alkaline-earth metals, such as Ba, Sr, metals of the third main group, or metals or semimetals of the fourth or fifth main group, such as Sn, Pb, Sb, or also Zn. In relation to individual positions, substitution can take place completely to form stoichiometric modifications, or to form non-stoichiometric mixed-crystal phases. The rare-earth elements and/or transition metals can in each case be substituted by another one or more of the metals indicated. As regards the rare-earth element oxides, it goes without saying that several rare-earth elements can also be located in one, several or all positions of the crystal structures in each case. Accordingly, as an alternative or in addition, the transition metals can likewise be partially substituted by one or more transition metals. It goes without saying that, in general, only one of the two positions RE or M in the rare-earth element oxide of the above formulas can also be substituted.

The rare-earth element content of the rare-earth element oxides indicated can be $\geq 5$ to 10 atom %, $\geq 20$ to 30 atom % or $\geq 40$ to 50 atom %, also $\geq 60$ to 70 atom % where appropriate, relative to the total metal content. The rare-earth element content of the above-mentioned oxides can in each case also be $\leq 95$ to 90 atom %, $\leq 70$ to 80 atom % or $\leq 50$ to 60 atom %, also $\leq 30$ to 40 atom % or $\leq 20$ to 25 atom % where appropriate, relative in each case to the total metal content. These figures refer to the original buffer material, i.e. without the further constituent forming a partial melt at $\leq 1,600°$ C., although they can also refer to the buffer material containing the further constituent. The original binary or multinary buffer material can thus form a (partial) melt at far higher temperatures, e.g. at $\geq 1,700$ to $1,800°$ C. or at $\geq 1,900$ to $2,000°$ C. The above-mentioned substitution or doping processes can, however, also jointly determine the growing properties, texture transfer, adhesive strength and/or the conditions required for precursor decomposition, e.g. also the necessary atmosphere.

The buffer layer material can generally display a phase width in relation to the oxygen content. For example, z can vary between 0 and $\pm 1$ or 0 and $\pm 0.5$ in the above-mentioned compounds; where appropriate, the oxygen lattice can thus also be sub-stoichiometric, i.e. z can be less than 0, but preferably not less than $-1$.

The buffer layer material, particularly the buffer layer material containing the further constituent, can, for example, crystallize with an NaCl, fluorite, pyrochlore, perovskite or $GdFeO_3$ structure, including ordered superstructures of the same where appropriate, particularly a fluorite structure, a pyrochlore structure or, where appropriate, another fluorite superstructure. It goes without saying that the content of the further constituent can be selected in such a way that optimum adaptation of the lattice constants of the buffer layer material to those of the substrate and/or the HTSC material can be achieved, referred to the lattice constants in the layer plane of the layer arrangement, taking superstructures into consideration where appropriate. For example, the lattice constants of the buffer layer material can lie at least roughly in the middle range of the lattice constants of the substrate and the HTSC layer, e.g. with a deviation of $\leq +5$ to 8% or $\leq 2$ to 3% or $\leq 0.75$ to 1%, in each case relative to the mean absolute value of the lattice constants of the substrate and the HTSC material in the principal plane of the layer arrangement, where, in the case of superstructures, the same applies to the lattice constants of the buffer layer material transposed and scaled to the elementary cell of the substrate.

The buffer layer can comprise multiple individual layers, the compositions of each of which can differ, e.g. as regards the buffer layer material, the content or the species of the further constituent forming a mixed phase. The individual buffer layers can, however, also at least essentially display the same composition, e.g. in order to produce a buffer layer of greater thickness.

The mixed-crystal phase buffer layer containing the further constituent can be applied directly to the substrate. Also applied to the substrate, where appropriate, can be a "nucleation layer," which can comprise an oxidic material, such as a titanate or zirconate, e.g. calcium titanate. This nucleation layer does not serve as a buffer layer, but essentially to prepare the substrate surface. It generally comprises a plurality of isolated, insular structures, and does not constitute an adequate diffusion barrier.

Alternatively or additionally, the further constituent in the buffer layer comprising multiple layers, which forms a mixed-crystal phase with the buffer layer material, can form the layer adjacent to the HTSC layer. The other layers of the buffer layer can be conventional buffer layers that do not display a further constituent forming a mixed-crystal phase. Where appropriate, several buffer material layers according to the invention can also be provided, each with one or more constituent(s) forming a mixed phase, where different constituents, or constituents in different concentrations, are present in the individual layers. To form the buffer material layer comprising multiple layers, the buffer materials can, for example, be applied to the respective substrate in the form of solvent-based solutions, and the solvent partially or completely removed. This can be followed by thermal treatment, where appropriate. After this, a further buffer material layer of the same or a different composition can then be applied. Preferably, the annealing treatment is performed, producing the oxide-ceramic buffer material, after formation of all buffer material layers; where appropriate, further buffer material layers can also be applied after annealing treatment. The solvent can be partially or completely removed, and the buffer material applied in the form of a precursor partially or completely decomposed, during the thermal treatment performed after application of the buffer material layer.

If the buffer layer has a multi-layer structure, the respective individual layers can be designed in such a way that they form an at least partial melt at a lower annealing temperature, or that the proportion (in parts by volume or weight) of the melt relative to the overall buffer layer increases at a given temperature. To this end, the content of the further constituent forming a homogeneous mixed-crystal phase relative to the buffer layer material can be increased, for example, or a constituent having a different effect can be used (e.g. silver instead of copper). In this context, the individual layer of buffer material adjacent to the HTSC layer can display a lower melting point (incongruent melting point) than buffer material layers more distant from the HTSC layer, which thus only form a smaller proportion of melt phase at the same temperature. As a result of this, the buffer material layer adjacent to the HTSC layer can be of a particularly smooth and particularly uniform nature, e.g. display particularly low porosity.

In particular, the buffer layer displaying the further constituent forming a homogeneous mixed phase can be deposited on a rare-earth oxide layer of a simple, binary or multinary oxide, e.g. on a cerium oxide layer ($CeO_2$, where the O position can also be sub-stoichiometric), a rare-earth/rare-earth oxide layer or a rare-earth/transition metal layer (e.g. a lanthanum zirconate layer, rare-earth zirconate layer, rare-earth cerium oxide layer or transition metal cerium oxide layer), that can display the composition $La_2Zr_2O_{7+x}$, $RE_2Zr_2O_{7+x}$, $RE_2Ce_2O_{7+x}$ or $TM_2Ce_2O_{7+x}$, where $0 \leq x \leq 1$, in which context this substrate layer does not contain the further constituent forming a homogeneous mixed phase, such as copper. The layers mentioned can, incidentally, be substituted, as also indicated above in connection with the buffer layers according to the invention, to which reference is herewith made.

On the other hand, the design of the buffer layer according to the invention makes it possible to design the buffer layer as just a single layer, meaning that, in the event of chemical solution deposition (CSD), the solution of buffer layer material need only be applied once, and the HTSC layer can already be applied after thermal pretreatment and annealing.

The buffer layer material can be applied in the form of a metal-organic precursor, such as a β-diketonate, particularly an acetylacetonate, alkyl carboxylate or the like. In general, a suitable solvent can be used that can contain, or consist of, a ketone, e.g. acetone, one or more alcohols, one or more carboxylic acids, without limitation to this. In particular, $C_2$-$C_8$ or $C_3$-$C_6$ or $C_3$-$C_4$ carboxylic acids can be used, each of which can have straight or branched chains, particularly also propionic acid and/or pivalic acid. Where appropriate, the above-mentioned solvents can also be used in combination with each other. The organic solvent can be essentially anhydrous.

Particularly preferably, the buffer layer material is used in the form of an alkyl carbonate displaying 1 to 10, preferably 2 to 8, or 3 to 6 C atoms, e.g. in the form of a propionate or pivalinate. The alkyl carbonate can generally have straight or branched chains or, where appropriate, also be cyclic.

The buffer layer material can also be applied in an aqueous solution. Suitable for use as water-soluble salts are, in particular, nitrates, carboxylates, particularly acetates, citrates or tartrates, individually or in combination. The aqueous solution can be set to a pH value of 4 to 8, preferably 5 to 7 or 6 to 7. The solution is preferably buffered, particularly by a thermally decomposable or volatilizable buffer, particularly ammonia or an ammonium salt.

The annealing treatment for crystallizing the buffer material can at least partly take place in a reducing atmosphere, e.g. under forming gas or another suitable gas with at least similar reductive capacity, where the forming gas ($N_2/H_2$) can contain 0.1 to 15%, 0.2 to 10%, 0.5 to 5% or 1 to 5% $H_2$, e.g. approx. 3% $H_2$ (percent by volume in each case). The buffer layer that contains the rare-earth element cerium oxide and is applied directly to the substrate can also be manufactured by annealing treatment in a non-reducing atmosphere, e.g. under pure nitrogen or another inert gas. Depending on the circumstances, this can also apply to other or all buffer layers of a multilayer buffer material coating. If the buffer layer containing the rare-earth element cerium oxide is applied to an intermediate layer of buffer material, located between it and the substrate, the buffer layer can be manufactured by annealing treatment in a reducing atmosphere, e.g. under forming gas; depending on the circumstances, this may also apply to the manufacture of other or all buffer layers according to the invention. In general, individual buffer layers can be manufactured in a non-reducing atmosphere, and other buffer layers of the same buffer layer structure of an HTSC layer arrangement in a reducing atmosphere.

The annealing treatment can be performed in such a way that the buffer layer containing the further constituent has a porosity of ≦25 to 30%, ≦15 to 20%, ≦5 to 10%, particularly preferably ≦2 to 3% or ≦1%, or that the layer is at least essentially free of pores.

The annealing treatment can be performed in such a way that the buffer layer containing the further constituent displays an RMS roughness (root-mean-square roughness) of ≦2.5 to 2 nm, preferably ≦1.6 to 1.8 nm or ≦1.2 to 1.4 nm, particularly preferably ≦1.0 to 0.8 nm, determined on an area of 1×1 μm².

The high-temperature superconductor applied to the buffer layer can be a rare-earth element copper oxide, particularly a rare-earth element/alkaline-earth metal copper oxide, where, independently of each other, the rare-earth element can be yttrium, and the alkaline-earth metal barium. It goes without saying that particularly the rare-earth element, e.g. yttrium, and/or the alkaline-earth metal, e.g. barium, can be partially substituted by other metals, e.g. by other rare-earth elements or alkaline-earth metals. In particular, the HTSC material can be a Y—Ba—Cu oxide ($YBa_2Cu_3O_x$) or a Bi—Sr—Ca—Cu oxide. For the purposes of the invention, the term "high-temperature superconductor" is generally to be taken to mean a superconductor with a superconductive transition temperature of ≧77 Kelvin, although another ceramic (oxidic) superconductor can generally also be applied to the buffer layer, where appropriate.

The buffer layer can generally display a thickness of 0.02 to 2 μm, or generally ≦5 μm, without limitation to this, and, where appropriate, in the range from 0.1 to 1 μm, 0.1 to 0.5 μm or in the range from 0.1 to 0.3 μm. The thickness of the substrate is not limited, as long as it displays sufficient mechanical strength. It can be in the range from 5 to 1,000 μm, from 10 to 500 μm, from 25 to 250 μm or in the range from 50 to 100 μm. A material promoting growing of the buffer layer can be applied to the substrate, preferably with an insular structure. Without being limited to this, the HTSC layer can display a thickness of ≧0.05 μm, particularly in the range from 0.1 to 50 μm or from 0.25 to 10 μm, preferably from 0.5 to 5 μm.

The substrate can be a suitable metal or an alloy, e.g. nickel or a nickel alloy, such as tungsten-doped nickel (e.g. Ni containing 5 to 10 atom % W), Hastelloy or the like. Where appropriate, however, the substrate can also be a ceramic material.

An example of the invention is described below and explained on the basis of the practical examples.

All coatings were applied by dip coating on a continuous strip-coating system with integrated drying section. However, other liquid-coating methods can also be used, e.g. printing methods, such as inkjet or screen printing, spray-coating methods, coating via capillaries or slot nozzles, or also batch-type coating methods. In all examples, the drawing speed is 10 m/h for a strip with a width of 1 cm. The substrate strip used in all instances is a biaxially roll-textured Ni strip with 5 atom % W having a thickness of 80 μm. 10 ml of each coating solution were prepared.

The layer thickness was determined by ellipsometer measurements (omt, VisuEL 3.6.2). Microcracks were assessed by dark-field examinations on an optical microscope (Zeiss Axiotech) or a scanning electron microscope (JEOL 6400F). The porosity was analyzed by TEM measurements (cross-section) and by ellipsometer measurements (omt, VisuEL 3.6.2). The roughness was determined on an AFM (Veeco CP-II) over an area of 1×1 μm², using a standard $Si_3N_4$ probe with k=0.06 N/m. In this context, the edge length of the area is much larger than the particle sizes of the buffer layer material, and much smaller that the particle sizes of the metal substrate. This ensures that several ceramic grains of the buffer layer material are measured within one substrate grain.

All the results are compiled in the results table.

EXAMPLE 1

Cerium Oxide

Anhydrous cerium propionate is dissolved in propionic acid in such a way that a 0.2 molar solution is obtained.

For a series of 5 coating solutions (1a-1e), 5, 10, 15, 20 and 25 atom % copper propionate, relative to cerium, are then added to this solution, and the solution is again diluted with propionic acid to 0.2 mol, relative to the sum of the metal ions. A copper-free solution (10 is prepared as a reference sample.

In accordance with the general description of the experiment, the solutions are applied to a substrate strip that already bears a layer of lanthanum zirconate. Drying is performed in air within 10 minutes at 120° C., annealing taking place under reducing conditions, more precisely under forming gas (3% $H_2$ in $N_2$), within 30 minutes at 1,000° C.

EXAMPLE 2

Cerium Oxide

Cerium acetate is dissolved in propionic acid in such a way that a 0.2 molar solution is obtained. For the coating solution, 10 atom % copper acetate, relative to cerium, are then added to this solution, and the solution is again diluted with propionic acid to 0.2 mol, relative to the sum of the metal ions.

In accordance with the general description of the experiment, the solution is applied to a substrate strip that already bears a double layer of lanthanum zirconate. Drying is performed in air within 10 minutes at 120° C., annealing taking place under forming gas (1% $H_2$ in $N_2$) within 30 minutes at 1,100° C.

EXAMPLE 3

Cerium Gadolinium Oxide

Cerium acetate and gadolinium acetate are diluted in propionic acid at a ratio of 4:1 in such a way as to obtain a 0.2 molar solution, relative to the sum of the metal ions. For the coating solution, 15 atom % copper acetate, relative to the sum of cerium and gadolinium, are then added to this solution, and the solution is again diluted with propionic acid to 0.2 mol, relative to the sum of the metal ions.

In accordance with the general description of the experiment, the solution is applied to a substrate strip that already bears a double layer of lanthanum zirconate. Drying is performed in air within 10 minutes at 150° C., annealing taking place under forming gas (5% $H_2$ in $N_2$) within 30 minutes at 1,000° C.

EXAMPLE 4

Cerium Oxide

Cerium acetylacetonate is dissolved in propionic acid in such a way that a 0.2 molar solution is obtained. For the coating solution, 10 atom % silver acetate, relative to cerium, are then added to this solution, and the solution is again diluted with propionic acid to 0.2 mol, relative to the sum of the metal ions.

In accordance with the general description of the experiment, the solution is applied to a substrate strip that already bears a double layer of lanthanum zirconate. Drying is performed in air within 10 minutes at 100° C., annealing taking place under forming gas (3% $H_2$ in $N_2$) within 20 minutes at 900° C.

EXAMPLE 5a

Cerium Oxide

Cerium nitrate and copper nitrate (ratio 9:1) are dissolved in citric acid at a ratio of 1:3 (total metal ions:citric acid). A 0.2 molar solution with a pH value of 6 is prepared by adding ammonia and water.

In accordance with the general description of the experiment, the solution is applied to a substrate strip that already bears a double layer of lanthanum zirconate. Drying is performed in air within 30 minutes at 200° C., annealing taking place under forming gas (5% $H_2$ in $N_2$) within 30 minutes at 900° C.

EXAMPLE 5b

Cerium Oxide (Reference Example to 5a)

Cerium nitrate and citric acid are dissolved in water in such a way that, relative to cerium ions, a 0.2 molar solution is obtained, whose ratio of metal ions to citric acid is 1:6. A solution with a pH value of 6.4 is prepared by adding ammonia and water.

In accordance with the general description of the experiment, the solution is applied to a substrate strip that has already been coated twice with lanthanum zirconate. Drying is performed in a vacuum in 180 minutes at 40° C., annealing taking place under nitrogen (99.999%) within 20 minutes at 950° C.

EXAMPLE 6

Lanthanum Zirconate

Lanthanum propionate, zirconium propionate and copper propionate are dissolved in propionic acid at a molar ratio of 9:9:1 in such a way that a 0.4 molar solution is obtained, relative to lanthanum.

The solution is applied to a metal substrate strip in accordance with the general description of the experiment. Drying is performed in air within 10 minutes at 120° C., annealing taking place under forming gas (5% $H_2$ in $N_2$) within 20 minutes at 1,000° C.

EXAMPLE 7

Lanthanum Cerate

Lanthanum propionate, cerium propionate and copper propionate are dissolved in propionic acid at a molar ratio of 9:9:1 in such a way that a 0.4 molar solution is obtained, relative to lanthanum.

The solution is applied directly to a metal substrate strip in accordance with the general description of the experiment. Drying is performed in air within 10 minutes at 120° C., annealing taking place under forming gas (5% $H_2$ in $N_2$) within 20 minutes at 950° C.

Results Table

| Solution No. | Layer thickness/nm | Cracks | Porosity/% | RMS roughness/nm |
|---|---|---|---|---|
| 1a | 35 | Few microcracks | 24 | 1.2 |
| 1b | 32 | No | 16 | 1.2 |
| 1c | 26 | No | 10 | 0.6 |
| 1d | 29 | No | 8 | 0.5 |
| 1e | 25 | Few microcracks | Not detectable | 1.8 |
| 1f (reference) | 33 | Microcracks | 35 | 2.8 |
| 2 | 22 | No | 15 | 1.0 |
| 3 | 30 | No | 12 | 0.8 |
| 4 | 28 | No | 8 | 0.6 |
| 5a | 30 | No | 14 | 1.2 |
| 5b (reference) | 21 | No | 19 | 3.5 |
| 6 | 151 | No | 10 | 2.5 |
| 7 | 165 | No | 30 | 2.1 |

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A high-temperature superconductor layer arrangement, comprising at least one substrate and one textured buffer layer comprising an oxidic buffer material permitting textured growing of a high-temperature superconductor (HTSC) layer, the buffer layer containing at least one further constituent forming a homogeneous mixed-crystal phase, wherein the further constituent comprises a metal or metal oxide that forms at least a partial melt with the oxidic buffer material at an annealing temperature of $\leq 1,600$ degrees Celsius;
   wherein the further constituent is present at a concentration of 2 atom % up to 40 atom %, relative to the total metal content of the buffer layer, and
   wherein the further constituent and the oxidic buffer material and/or their respective precursors are deposited on the substrate separately or together as a chemical solution to provide a solution-coated substrate, and the solution-coated substrate is subjected to an annealing treatment, such that a homogeneous mixed-crystal phase containing the further constituent is formed.

2. The layer arrangement according to claim 1, wherein the is further constituent comprises a metal selected from copper, silver and mixtures thereof.

3. The layer arrangement according to claim 1, wherein the further constituent is present at a concentration of 2 to 30 atom %, relative to the total metal content of the buffer layer.

4. The layer arrangement according to one of claim 1, wherein the buffer layer material containing the further constituent forms at least a partial melt at an annealing temperature of $\leq 1,250$ degrees Celsius.

5. The layer arrangement according to one of claim 1, wherein the buffer layer material taking up the further constituent comprises at least one material selected from the group comprising: rare-earth oxide, main-group metal oxide or transition metal oxide, including respectively binary, ternary or multinary oxides thereof, zirconates, aluminates, titanates, manganates, and ruthenates.

6. The layer arrangement according to claim 5, wherein the buffer layer material taking up the further constituent is a binary or multinary rare-earth oxide, where the metal components are partly or exclusively rare-earth elements, and two or more different rare-earth elements are contained.

7. The layer arrangement according to claim 6, wherein the buffer layer material taking up the further constituent is a rare-earth element oxide having the general formula $RE_{2+x}M_{2+y}O_z$, where $-2 \leq x, y \leq 2$, where RE is one or more rare-earth elements and M is one or more divalent, trivalent, tetravalent or pentavalent metals, including rare-earth elements.

8. The layer arrangement according to claim 7, wherein M is one or more metals from the group comprising rare-earth element, hafnium, and zirconium.

9. The layer arrangement according to claim 7, wherein RE and/or M are, independently of each other, partially substituted by a transition metal and/or a main-group metal, or M constitutes a transition or main-group metal or a combination thereof.

10. The layer arrangement according to claim 1, wherein the buffer layer containing the further constituent has a porosity of $\leq 25\%$.

11. The layer arrangement according to claim 1, wherein the buffer layer containing the further constituent displays an RMS roughness of $\leq 1.8$ nm.

12. The layer arrangement according to claim 1, wherein the buffer layer comprises multiple layers, and the mixed-crystal phase buffer layer containing the further constituent is located on the substrate.

13. The layer arrangement according to claim 1, wherein the buffer layer comprises multiple layers, and the mixed-crystal phase buffer layer containing the further constituent forms a layer adjacent to the high-temperature superconductor layer.

14. The layer arrangement according to claim 1, wherein the buffer layer located between the substrate and the HTSC layer comprises only layers having a further constituent forming a homogeneous mixed-crystal phase.

15. The layer arrangement according to claim 1, wherein the buffer layer is of only single-layer design.

16. A method for manufacturing a high-temperature superconductor layer arrangement, the method comprising applying to a substrate a textured buffer layer material permitting textured growing of a high-temperature superconductor, wherein at least one further constituent forming a homogeneous mixed-crystal phase is incorporated into the buffer layer material, the further constituent comprises a metal or metal oxide that forms at least a partial melt with the buffer layer material during annealing at $\leq 1,600$ degrees Celsius,
wherein the further constituent is added at a concentration of 2 atom % to 40 atom %, relative to the total metal content of the buffer layer,
wherein the further constituent and the buffer layer material and/or their respective precursors are deposited on the substrate separately or together as a chemical solution to form a solution-coated substrate, and the solution-coated substrate is subjected to an annealing treatment, such that a homogeneous mixed-crystal phase containing the further constituent is formed, and
  (i) wherein the annealing treatment is carried out such that the buffer layer has a porosity of $\leq 25\%$ or
  (ii) wherein the annealing treatment is carried out such that the buffer layer has an RMS roughness of $\leq 1.8$ nm,
  (iii) or both (i) and (ii) in combination.

17. The method according to claim 16, wherein the further constituent comprises a metal selected from copper, silver and mixtures thereof.

18. The method according to claim 16, wherein the at least one further constituent is added in such a way that the resultant buffer layer material forms at least a partial melt at an annealing temperature of $\leq 1,250$ degrees Celsius.

19. The method according to claim 16, wherein a buffer layer material is applied that at least essentially consists of a material selected from the group comprising: rare-earth oxide, main-group metal oxide or transition metal oxide, including respectively binary, ternary or multinary oxides thereof, zirconates, aluminates, titanates, manganates, and ruthenates.

20. The method according to claim 19, wherein the buffer layer material taking up the further constituent is a binary or multinary rare-earth oxide, where the metal components are partly or exclusively rare-earth elements, and two or more different rare-earth elements are contained.

21. The method according to claim 16, wherein a rare-earth element oxide having the general formula $RE_{2-x}M_{2-y}O_{7\pm 2z}$, where $0 \leq x, y, z \leq 1$, is used as the buffer layer material taking up the further constituent, where RE is one or more rare-earth elements and M is one or more divalent, trivalent, tetravalent or pentavalent metals, including rare-earth elements.

22. The method according to claim 16, wherein the buffer layer material is applied in multiple layers, and the mixed-crystal phase buffer layer containing the further constituent is formed on the substrate and/or as a layer adjacent to the high-temperature superconductor layer.

23. The method according to claim 16, wherein the buffer layer material is formed by just a single layer, or by multiple layers, that display(s) a further constituent forming a homogeneous mixed-crystal phase.

24. The method according to claim 16, wherein the further constituent and the buffer layer material are deposited on the substrate either together or separately.

25. The method according to claim 16, wherein metal components of the buffer layer material and/or of the further constituent are at least partially applied to the substrate or an existing buffer material layer, including its precursors, as alkyl carboxylates, acetylacetonates or in a form of other optionally chelate-forming complexes in an organic solvent.

26. The method according to claim 16, wherein metal components of the buffer layer material and/or of the further constituent are applied to the substrate or an existing buffer material layer, including its precursors, in a form of water-soluble compounds in an aqueous solution.

27. The method according to claim 16, wherein the annealing treatment for producing the buffer layer containing the further constituent at least partly takes place in a reducing atmosphere.

28. The layer arrangement according to one of claim 1, wherein the buffer layer material containing the further constituent forms at least a partial melt at an annealing temperature of $\leq 1,400$ degrees Celsius.

29. The method according to claim 16, wherein the at least one further constituent is added in such a way that the resultant buffer layer material forms at least a partial melt at an annealing temperature of $\leq 1,400$ degrees Celsius 30. A high-temperature superconductor layer arrangement, comprising at least one substrate and one textured buffer layer made of oxidic material, that permits textured growing of a high-temperature superconductor (HTSC) layer,
wherein the buffer layer contains at least one further constituent forming a homogeneous mixed-crystal phase, said constituent being a metal or metal oxide that forms at least a partial melt with the oxidic buffer material at an annealing temperature of $\leq 1,250°$ C.,
wherein the further constituent is present at a concentration of 2 atom % to 40 atom %, relative to the total metal content of the buffer layer, and wherein the further constituent and the buffer layer material and/or their respective precursors are deposited on the respective substrate separately or together as a chemical solution to provide a solution-coated substrate, and the solution-coated substrate is subjected to an annealing treatment, such that the homogeneous mixed-crystal phase containing the further constituent is formed.

31. A high-temperature superconductor layer arrangement, comprising at least one substrate and one textured buffer layer made of oxidic material, that permits textured growing of a high-temperature superconductor (HTSC) layer, wherein the buffer layer contains at least one further constituent forming a homogeneous mixed-crystal phase, said constituent being a metal or metal oxide that forms at least a partial melt with the oxidic buffer material at an annealing temperature of $\leqq 1,600°$ C., wherein the further constituent is present at a concentration of 2 atom % to 40 atom %, relative to the total metal content of the buffer layer, wherein the further constituent and the buffer layer material and/or their respective precursors are deposited on the respective substrate separately or together as a chemical solution to provide a solution-coated substrate, and the solution-coated substrate is subjected to an annealing treatment, such that the homogeneous mixed-crystal phase containing the further constituent is formed, and wherein the porosity of the buffer layer containing the further constituent is $\leqq 25\%$.

32. A high-temperature superconductor layer arrangement, comprising at least one substrate and one textured buffer layer made of oxidic material, that permits textured growing of a high-temperature superconductor (HTSC) layer, wherein the buffer layer contains at least one further constituent forming a homogeneous mixed-crystal phase, said constituent being a metal or metal oxide that forms at least a partial melt with the oxidic buffer material at an annealing temperature of $\leqq 1,600°$ C., wherein the further constituent is present at a concentration of 2 atom % to 40 atom %, relative to the total metal content of the buffer layer, wherein the further constituent and the buffer layer material and/or their respective precursors are deposited on the respective substrate separately or together as a chemical solution to provide a solution-coated substrate, and the solution-coated substrate is subjected to an annealing treatment, such that the homogeneous mixed-crystal phase containing the further constituent is formed, wherein the porosity of the buffer layer containing the further constituent is $\leqq 25\%$, and wherein the buffer layer containing the further constituent displays an RMS roughness of $\leqq 1.8$ nm.

33. A high-temperature superconductor layer arrangement, comprising at least one substrate and one textured buffer layer made of oxidic material, that permits textured growing of a high-temperature superconductor (HTSC) layer, wherein the buffer layer contains at least one further constituent forming a homogeneous mixed-crystal phase, said constituent being a metal or metal oxide that forms at least a partial melt with the oxidic buffer material at an annealing temperature of $\leqq 1,600$ degrees Celsius, wherein the transition metal is selected from copper, silver and mixtures thereof, wherein the further constituent is present at a concentration of 2 atom % to 40 atom %, relative to the total metal content of the buffer layer, and wherein the further constituent and the buffer layer material and/or their respective precursors are deposited on the respective substrate separately or together as a chemical solution to provide a solution-coated substrate, and the solution-coated substrate is subjected to an annealing treatment, such that the homogeneous mixed-crystal phase containing the further constituent is formed.

* * * * *